United States Patent
Kobayashi et al.

(10) Patent No.: US 6,664,549 B2
(45) Date of Patent: Dec. 16, 2003

(54) WAFER CHUCK, EXPOSURE SYSTEM, AND METHOD OF MANUFACTURING SEMICONDUCTOR DEVICE

(75) Inventors: Seiichiro Kobayashi, Ome (JP); Koichi Koyanagi, Ome (JP); Teruo Honda, Ome (JP); Hideo Saeki, Ome (JP); Masaharu Motohashi, Ome (JP)

(73) Assignee: Hitachi Tokyo Electronics Co., Ltd., Tokyo (JP)

( * ) Notice: Subject to any disclaimer, the term of this patent is extended or adjusted under 35 U.S.C. 154(b) by 0 days.

(21) Appl. No.: 10/182,389

(22) PCT Filed: Jan. 26, 2001

(86) PCT No.: PCT/JP01/00523

§ 371 (c)(1),
(2), (4) Date: Jul. 29, 2002

(87) PCT Pub. No.: WO01/56074

PCT Pub. Date: Aug. 2, 2001

(65) Prior Publication Data

US 2003/0001103 A1 Jan. 2, 2003

(30) Foreign Application Priority Data

Jan. 28, 2000 (JP) .......................................... 2000-20036

(51) Int. Cl.$^7$ ............................ H01L 21/68; H01L 21/27
(52) U.S. Cl. ........................ 250/440.11; 355/72; 355/73
(58) Field of Search ...................... 250/440.11, 455.11, 250/441.11; 355/53, 72, 73

(56) References Cited

U.S. PATENT DOCUMENTS 5,923,408 A * 7/1999 Takabayashi ................. 355/53
6,307,620 B1 * 10/2001 Takabayashi et al. ......... 355/72
6,461,980 B1 * 10/2002 Cheung et al. ............... 438/765
6,563,586 B1 * 5/2003 Stanke et al. ................. 356/445

FOREIGN PATENT DOCUMENTS

| JP | 03163848 A | | 7/1991 |
| JP | 08037227 A | | 2/1996 |
| JP | 08195428 A | | 7/1996 |
| JP | 10242255 A | | 9/1998 |
| JP | 2001185607 A | * | 7/2001 |

OTHER PUBLICATIONS

"VLSI Manufacturing and Test Device Guidebook in 1998" issued by Kogyo Chosakai Publishing Co., Ltd. Japan, (Nov. 20, 1997), p. 56, which is cited in the Specification.

* cited by examiner

Primary Examiner—John R. Lee
Assistant Examiner—Paul M. Gurzo
(74) Attorney, Agent, or Firm—McCormick, Paulding & Huber LLP

(57) ABSTRACT

In a wafer chuck for flatly vacuum-chucking a semiconductor wafer (11) supported by support pins (15) such that a pressure in a suction chamber (13) surrounded by an external wall (12), the upper surface of the external wall (12) is formed to be lower than the upper surfaces of the support pins, and the upper surface of the external wall (12) does not pressure the semiconductor wafer (11), a distance (L1) between the external wall (12) and closest support pins (15a) is up to 1.8 mm, and an alignment pitch. (L2) of the support pins (15) aligned inside the closest support pins (15a) to the external wall (12) is not more than 1.5 times of the distance (L1) between the external wall (12) and the closest support pins (15a).

10 Claims, 6 Drawing Sheets

WAFER CHUCK, EXPOSURE SYSTEM, AND METHOD OF MANUFACTURING SEMICONDUCTOR DEVICE

CROSS REFERENCE TO RELATED APPLICATIONS

This application claims priority from and incorporates by reference the subject matter of PCT Application No. PCT/JP01/0053 filed on Jan. 26, 2001 and Japanese Patent Application No. 2000-20036 filed on Jan. 28, 2000.

TECHNICAL FIELD

The present invention relates to a wafer chuck and an exposure technique which use the wafer chuck, and to a manufacturing technique of semiconductor device and, more particularly, to a technique which is effectively applied to a wafer chuck or the like used for vacuum-chucking a semiconductor wafer in the steps in manufacturing a semiconductor device.

BACKGROUND ART

For example, in an exposure system which coats a resist on a semiconductor wafer and which exposes and develops a circuit pattern of one layer formed on a reticle serving as an original so as to form a predetermined resist pattern on the semiconductor wafer, the degree of flatness of the semiconductor wafer is an important technical object in order to prevent resolving defects caused by not obtaining an image formation within a focal depth and to form a sharp circuit pattern. For this reason, a flat state of the semiconductor wafer is to be required by such a way that the wafer is vacuum-chucked from the rear surface thereof by a wafer chuck having a high degree of flatness. An exposure process is performed to the wafer.

As an example in which such an exposure system is described in detail, "VLSI MANUFACTURING AND TEST DEVICE GUIDEBOOK IN 1998" issued by Kogyo Chosakai Publishing Co., Ltd. (Nov. 20, 1997) is known. The wafer chuck has a configuration in which a large number of support pins are implanted inside a cap-like vessel. However, in this structure, the outer peripheral wall of the cup-like vessel and the large number of support pins are brought into contact with the rear surface of the semiconductor wafer so as to apply the negative pressure into the cap-like vessel, thereby supporting the semiconductor wafer. Therefore, warpage of the peripheral portion of the semiconductor wafer is not sufficiently corrected. Since micropatterning in a process makes the focal depth further small, flattening a semiconductor wafer in exposure becomes an important technical object every year.

With respect to the art, as an important which increases the degree of flatness in the peripheral portion of a semiconductor wafer, an art disclosed in Japanese Patent Application Laid-Open No. 8-37227 is known. This art can achieve a predetermined effect such an in correction of upward warping transformation at the peripheral portion of the semiconductor wafer.

SUMMARY OF THE INVENTION

However, in the wafer chuck described in the above conventional art, a sufficient degree of flatness cannot be achieved. More specifically, when a wafer is warped reversely (downwardly) in the above invention, the invention does not disclose a predetermined relationship in shape which corrects the warpage so that wafer correction for realizing a high degree of flatness in the entire area of the semiconductor wafer has a given limit.

It is an object of the present invention to provide a technique which can more effectively prevent warpage of a semiconductor wafer vacuum-chucked on a wafer check and which can realize a high degree of flatness of the entire area of the semiconductor wafer.

It is another object of the present invention to provide a technique which can vacuum-chuck semiconductor wafers having various diameters on single wafer chuck.

It is still another object of the present invention to provide a technique which can improve the manufacturing yield of semiconductor devices.

The above objects and other objects of the present invention and novel characteristic features will be apparent from the description of this specification and the accompanying drawings.

The outline of typical one of the aspects of the present invention will be briefly described below.

More specifically, a wafer chuck according to the present invention is adopted to flatly vacuum-chucks a semiconductor wafer having a rear surface which is held on support pins by suction with a suction chamber at a negative pressure applied thereto, the suction chamber surrounded by an external wall, wherein the upper surface of the external wall is formed to have a level slightly lower than those of the upper surfaces of the support pins; the external wall does not chuck the semiconductor wafer and does not in contact with the semiconductor wafer; and air is slightly sucked into the suction chamber.

In addition, the wafer chuck is characterized in that the distance between the external wall and the closest support pin is kept constant, a moment is generated such that the gradient of the semiconductor wafer being in contact with the outermost closest support pin is small, and flexure of the semiconductor wafer caused by vacuum is minimum.

An exposure system according to the present invention is characterized by being constituted by using the wafer chuck.

A method of manufacturing a semiconductor device according to the present invention applies the wafer chuck to the step of polishing a semiconductor wafer and an exposure system for exposing the semiconductor wafer to manufacture a semiconductor device.

According to the wafer chuck having the above constitution, inflow air generates a pressure loss by the external wall to make the pressure in the suction chamber negative, a vacuum pressure between the external wall and the closest support pin is generated by the negative pressure. When a moment generated by the vacuum pressure is equal to moment acting on the internal side of the closest support pin, the wafer is not inclined at a position above the closest support pin because the moments are balanced.

In addition, when the distance between the external wall and the closest support pin is not more than a predetermined distance, flexure or gradient of the wafer from the closest support pin to an external bank can be made sufficiently small. For this reason, the degree of flatness of the wafer near the peripheral portion of the wafer can be maintained at high accuracy.

According to the exposure system using the wafer chuck described above, even in a micropatterning process having a small focal depth, a preferable circuit pattern can be transferred to a semiconductor wafer.

According to the method of manufacturing a semiconductor using the wafer chuck or the exposure system, a semiconductor device can be manufactured even in a micro-patterning process having a small focal depth.

DESCRIPTION OF THE PREFERRED EMBODIMENTS

Embodiments of the present invention will be described below in detail with reference to the drawings.

(Embodiment 1)

Figure 1:
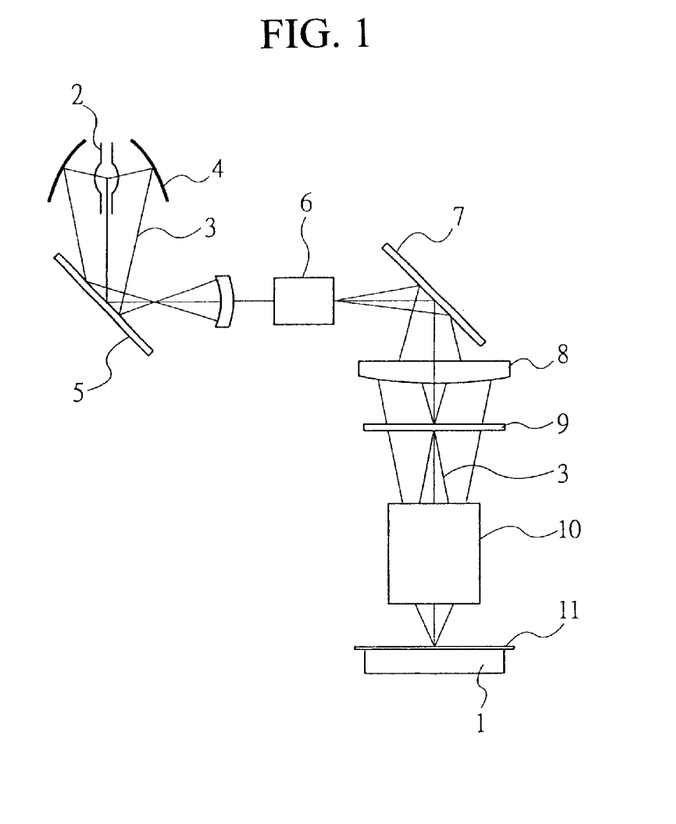
FIG. 1 is a conceptual diagram showing an exposure system using a wafer chuck according to an embodiment of the present invention.
Figure 2:
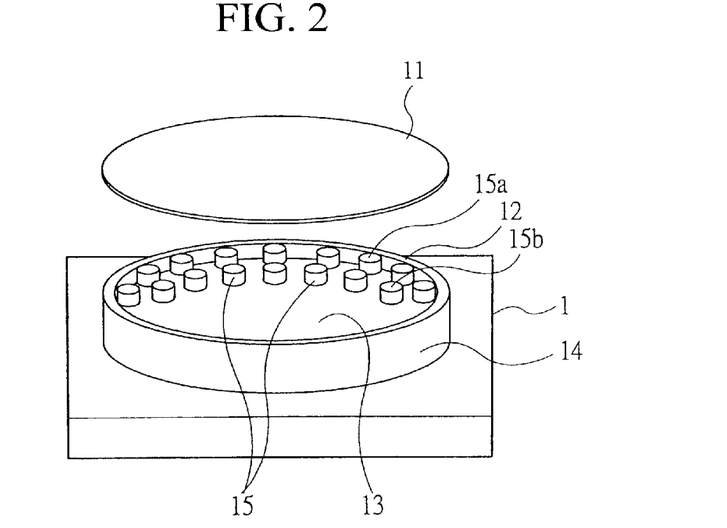
FIG. 2 is a perspective view showing the wafer chuck according to the embodiment of the present invention and a semiconductor wafer.
Figure 3:
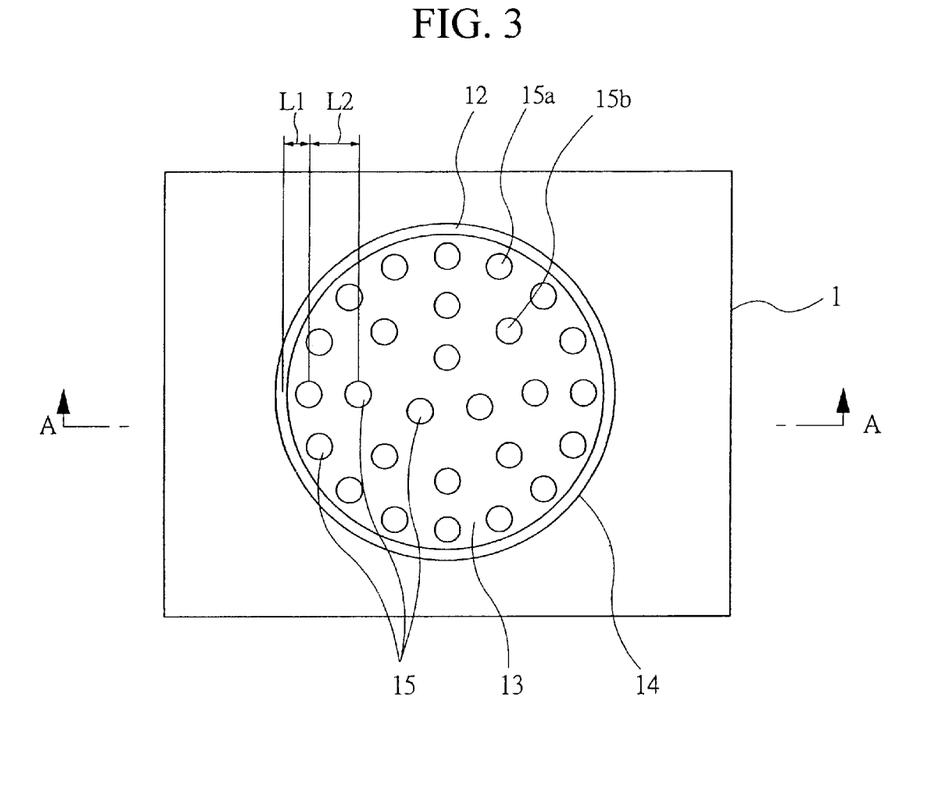
FIG. 3 is a plan view of the wafer chuck according the embodiment of the present invention.
Figure 4:
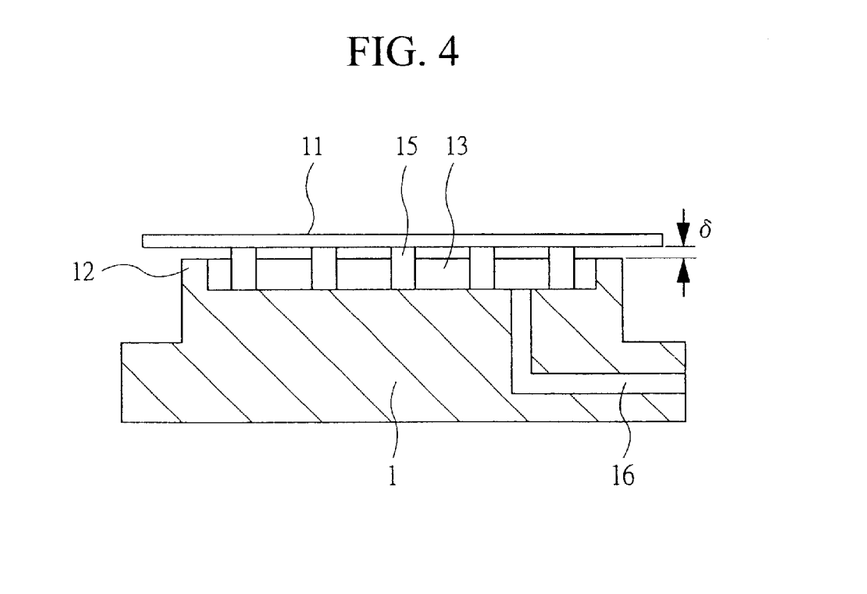
FIG. 4 is a schematic sectional view of a part along a line A—A in FIG. 3.

FIG. 1 is a schematic diagram showing an exposure system using a wafer chuck according to an embodiment of the present invention, FIG. 2 is a perspective view showing the wafer chuck and a semiconductor wafer, FIG. 3 is a plan view of the wafer chuck in FIG. 2, and FIG. 4 is a schematic sectional view of a part along a line A—A in FIG. 3.

As shown in FIG. 1, an exposure system provided with a wafer chuck uses, for example, an Hg lamp 2 as an exposure light source. Exposure light 3 emitted from the Hg lamp 2 is converged by an elliptic mirror 4 and then converged by a condensing lens 8 through a reflector 5, a relay lens 6, and a reflector 7. The light passing through the illumination system takes a circuit pattern formed in a reticle 9, and is reduced by a reduction lens 10, so that the light is finally projected on a semiconductor wafer 11 chucked by a wafer chuck 1. In this manner, the circuit pattern is transferred onto the semiconductor wafer 11 on which a resist is coated.

The wafer chuck 1 is comprised of a material such as ceramics to prevent transformation caused by aging or thermal expansion and is arranged to chuck the semiconductor wafer 11. As shown in FIG. 2, the wafer chuck includes a suction chamber 13 which is surrounded by an external wall 12 and which is formed in a chuck body 14. The suction chamber 13 is connected to an external exhaust pump or the like (not shown) through a suction hole 16. As shown in FIG. 3, the external wall 12 is formed to have a size which is slightly smaller than that of the semiconductor wafer 11, and is curved to the rear surface of the semiconductor wafer 11 to prevent adhesion or the like of the coated resist solution.

The upper surface of the external wall 12 is designed to be slightly lower than the level of a plurality of support pins 15 which support the semiconductor wafer 11 from its rear surface. The rear surface of the semiconductor wafer 11 and the upper surface of the external wall 12 have a small gap δ. Therefore, the suction chamber 13 from which air is exhausted through the suction hole 16 communicates with the outside through the gap. A leakage flow rate Q is expressed by the following equation from theoretical calculation and an experimental result.

$$Q = 3b\delta^3/4\mu \cdot dp/dx \qquad \text{(Equation 1)}$$

where, b: peripheral length of external wall, δ: gap, μ: viscosity coefficient, dP/dx: pressure gradient. As shown in Equation 1, when the gap is made small, the viscosity of air flowing in the gap strongly acts, and a pressure loss generated when air passes through the external wall 12 (vacuum seal is established from when the pressure loss is generated).

As an experimental example, the semiconductor wafer 11 (rear surface is satin-finished) having a diameter φ of 200 was used, the width of the external wall 12 was 0.3 mm, the gap δ was 0.5 μm, and the pressure of a vacuum source was 0.79 kPa (600 mmHg). In this case, a decrease in pressure caused by inflow of air from the external wall 12 was 3.2%. In the same way, a decrease in pressure in a conventional structure in which the external wall 12 was in contact with a pin was 1.3%. When the width of the external wall 12 and the gap δ are changed, a decrease in pressure can be controlled. For this reason, the wafer chuck 1 which copes with a change in diameter of the semiconductor wafer 11 tan be manufactured.

When the semiconductor wafer 11 are supported by the sharp-pointed support pins 15, the pressing pressures are generated at the tops of the support pins 15 due to a pressure difference dP between the pressure of the suction chamber 13 and the atmospheric pressure. However, it is experientially known that a result is obtained on the assumption that transformation of a portion pressed by a continuous surface such as the surface of the external wall 12 is different from transformation of a portion pressed by the tops of the support pins 15. This difference is related to a vacuum pressure, the areas of the tops of the pins, the arrangement of pins, the condition of the rear surface of the semiconductor wafer 11, and the like.

In this embodiment, although no continuous contact portion is provided between the rear surface of the semiconductor wafer 11 and the upper surface of the external wall 12, the arrangement of the support pins 15 must be considered. When the alignment pitches of the support pins 15 are set as equal as possible, and when closest support pins 15a to the external wall 12 is arranged to receive vacuum pressures which are equal to each other, the highest degree of flatness can be obtained regardless of the condition of the rear surface of the semiconductor wafer 11. More specifically, the support pins 15a may be arranged such that a distance (distance L1) between the external wall 12 and the closest support pin 15a is almost equal to half an alignment pitch L2 of the support pins 15. When an accuracy error of within ±50 nm is set on a target, the alignment pitch L2 of the internal support pins 15 and the distance L1 between the external wall 12 and the closest support pin 15a desirably satisfy a relation: L2/6≦L1≦L2.

The relation between the distance L1 between the external wall 12 and the closest support pins 15a and the alignment pitch L2 of the internal support pins 15 can be applied to not only alignment pitches in a radial direction of the wafer chuck as described above but also alignment pitches in a circumferential direction.

More specifically, from a viewpoint that the pressures received by the support pins are set as equal as possible, the alignment pitch L2 is set to be not more than 1.5 times the distance L1 between the external wall 12 and the closest support pins 15a for the following reason.

It must be necessary for realizing a high degree of flatness of the semiconductor wafer 11 that pressures acting on the tops of the support pins 15 are set as equal as possible. That is, in vacuum chucking, an area on which the atmospheric pressure acts is equally shared by the support pins 15.

In particular, a problem is outstandingly posed at a peripheral portion (internal wall 17) of a press-up hole 18 into/from which a press-up pin 19 for pressing the semiconductor wafer 11 illustrated in FIG. 5 (to be described later) enters. Especially, pressures acting on the tops of the closest support pins 15a to the internal wall 17 is considerably influenced on the degree of flatness.

An experimental check for forecasting distortion is performed with respect to this influence.

Figure 8:
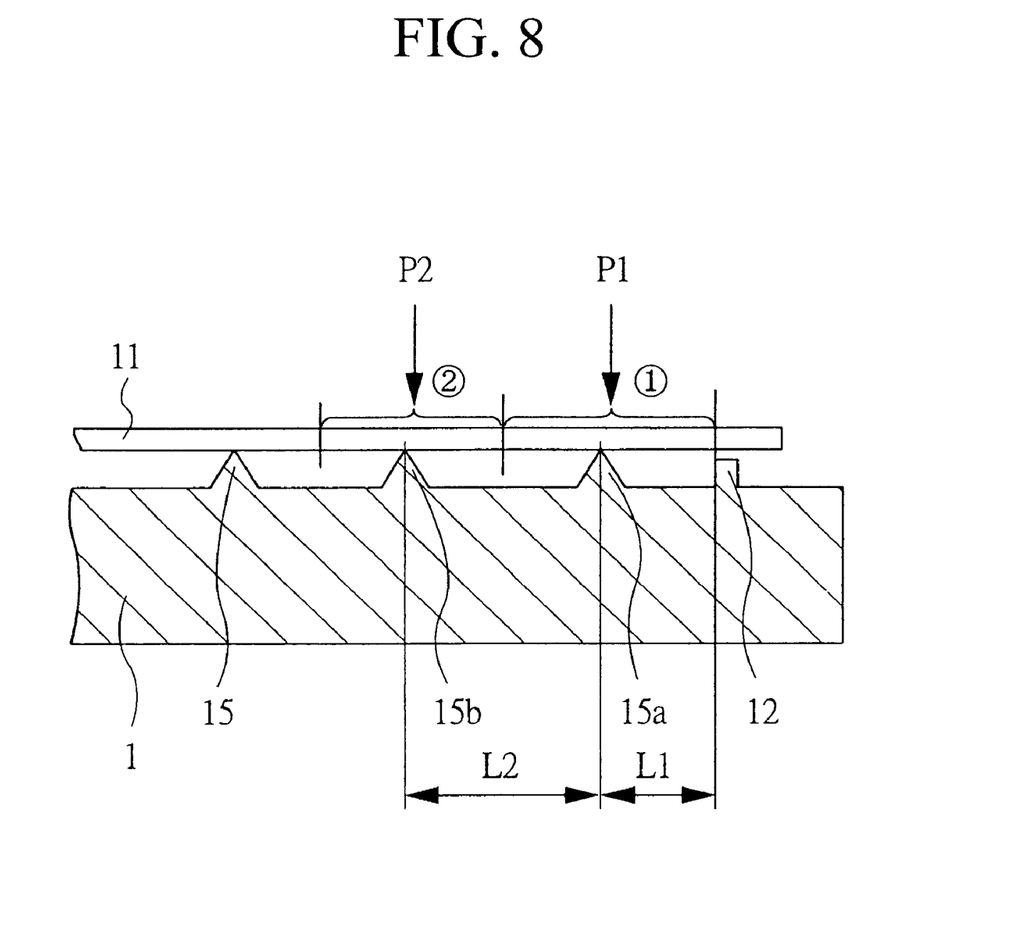
FIG. 8 is a diagram for explaining an example of the operation of the wafer chuck according to the embodiment of the present invention.

In the experiment, as illustrated in FIG. 8, the ratio of the density of alignment of the closest support pins 15a which were closest to the internal wall 17 to the density of alignment of support pins 15b which were adjacently outside the alignment of the closest support pins 15a was changed to 1.5 times, and the ratio of a pressure P1 (pressure of area ①) acting on the top of the support pin 15a to a pressure P2 (pressure of area ②) acting on the top of the support pin 15b was set to be 1.5 times to 1/1.5 times. In this case, a distortion of about 90 nm was measured. Since the distortion is 100 nm or less because of other factors, it is considered that the ratio of 1.5 times is the limit of practical use. As a matter of course, in order to obtain a higher accuracy, the ratio should be made closer as possible to 1.0 times rather than 1.5 times.

The value L2 must be 1 mm or more because of restrictions or the like of actual processing technology of the wafer chuck 1. On the assumption, if P1/P2=①/② is allowed to be 1.5 times to 1/1.5 times as described above, the minimum value the value L2 is 1 mm as described above, in order to control the ratio of area ① to area ② to 1.5 times to 1/1.5 times, the following conditions are satisfied.

When the ratio is 1.5 times, L1=L2 is satisfied because L2/2+L1 (=L2)=1.5 times L2 is satisfied.

When the ratio is 1/1.5 times, L1=1/6=0.17 mm because L2/2+L1 (=L2/6)=L2·2/3 is satisfied.

However, since L1 is limited to about 0.2 mm due to the restrictions of processing technology, the minimum value of L1 is 0.2 mm.

On the other hand, the distance L1 between the external wall 12 and the closest support pin 15a is desirably set to be up to about 1.8 mm in consideration of flexure of a beam.

The reason why the distance L1 between the external wall 12 and the closest support pins 15a is set to be up to 1.8 mm will be described below.

It is assumed that pitches of the closest support pins 15a to the external wall 12 and the support pins 15b which are internally adjacent to the closest support pins 15a are represented by L2, an overhang (i.e., distance between the external wall 12 and the closest support pin 15a) of the peripheral portion of the semiconductor wafer 11 is represented longitudinal by L1, a distributed load is represented by w, a longitudinal elastic coefficient E, and a geometrical moment of inertia is represented I. In this case, a flexure y of the distal end (immediately above the external wall 12) of the overhang is approximately expressed by the following equation:

$$y = w(L1)^4/8EI + w(L1)^3 L2/6EI \quad \text{(Equation 2)}$$

An Si substrate is supposed as the semiconductor wafer 11, 80 kPa (600 mmHg) are substituted to w, 1.8 mm are substituted to L1, 2 mm are substituted to L2, 166 MPa is substituted to E, and the thickness of the semiconductor wafer 11 is given by 0.725 mm→I=0.0318 mm$^4$. In this case, the flexure y is given by y=50 nm. In order to achieve a degree of flatness of 100 nm or less, it is proper that the factor of flexure is set to be 50 nm or less. For this reason, it is considered as the necessary condition that L1 is 1.8 mm or less.

(Embodiment 2)

In the wafer chuck 1 according to Embodiment 1, an inflow rate of external air changes depending on the distance of the gap between the semiconductor wafer 11 and the upper surface of the external wall 12. The inflow rate of the air is expressed by Equation 1. In this case, when the gap δ is excessively large, the inflow rate of the gas increases to decrease the pressure in the suction chamber 13. When the inflow rate is excessively small, the semiconductor wafer 11 is brought into contact with the upper surface of the external wall 12, and the effect described in Embodiment 1 may not be achieved. In addition, when foreign material adhered to the rear surface of the semiconductor wafer 11 is sandwiched between the semiconductor wafer 11 and the external wall 12, the foreign material mounds the corresponding portion of the semiconductor wafer 11 and may deteriorate the degree of flatness.

In an experiment, it is assumed that a semiconductor wafer 11 having a diameter φ of 200 and a satin-finished rear surface is used, the width of the external wall 12 is 0.3 mm, and the gap distance is 0.5 μm. About 3% of pressure in the suction chamber 13 decreases. It is assumed that an actual tolerance of a decrease in pressure is set to be 10%. The value is applied to Equation 1.

When the width of an external wall is 0.3 mm, the gap δ is 0.75 μm at the maximum; and when the width of the external wall is 2.0 mm, the gap δ is 1.4 μm at the maximum, so that such values are considered to the maximum until which the gap δ can be set.

In addition, a gap δ of 0.1 μm or more is required at the minimum such that the semiconductor wafer 11 is not brought into contact with the external wall 12.

When the width of the external wall 12 is 2.0 mm or more, the flexure of the peripheral portion of the semiconductor wafer 11 increases due to the influence of a vacuum pressure. For this reason, it is desirable that the width is set to be 2.0 mm or less.

(Embodiment 3)

In the wafer chuck 1 according to Embodiment 1 wherein the closest support pins 15a are arranged to be in one circle along the external wall 12 and the support pins 15b on the second circular line are arranged inside the closest support pins 15a to be in one circle, the interval between the closest support pins 15a and the support pins 15b is important to obtain the high accuracy of the degree of flatness of the peripheral portion of the semiconductor wafer 11.

More specifically, in a semiconductor wafer 11 warped at an average curvature of 1/R, the semiconductor wafer 11 should be vacuumed so as to correct the warpage, so that an arrangement condition of the support pins 15 for performing correction at the outermost portion is required.

In the structure of a wafer chuck of a conventional art, the external wall 12 is in contact with the semiconductor wafer 11 to serve as a vacuum seal. For this reason, at the portion where the semiconductor wafer 11 is in contact with the external wall 12, the average curvature of the semiconductor wafer 11 cannot be sufficiently corrected to leave a gradient.

In this embodiment, the gradient of the semiconductor wafer 11 can be decreased at the contact portions to the semiconductor wafer 11 of the closest support pins 15a to the external wall 12, and the support pins 15b on the second circular line are arranged inside the outermost pins 15a to form in one circle such that contact surface pressures of the closest support pins 15a to the external wall 12 are equal to those of the other support pins 15, so that the arrangement density of the support pins 15 is made uniform and that the degree of flatness of a portion near the external wall 12 where a high degree of flatness cannot be easily obtained, can be improved. In this case, as described above, the distance (alignment pitch L2) between the closest support pins 15a to the external wall 12 and the support pins 15b on the second circular line is preferably set to be a value falling within a range of 1 to 2.5 mm, more preferably, 2 mm in order to easily obtain the accuracy of the degree of flatness of the semiconductor wafer 11

The case in which the areas of the tops of the support pins 15 are set equal to each other has been described above. However, in the case where the arrangement density of the support pins 15 is not uniform, the areas of the tops of the support pins 15 may be changed depending on the density.

(Embodiment 4)

Figure 5:
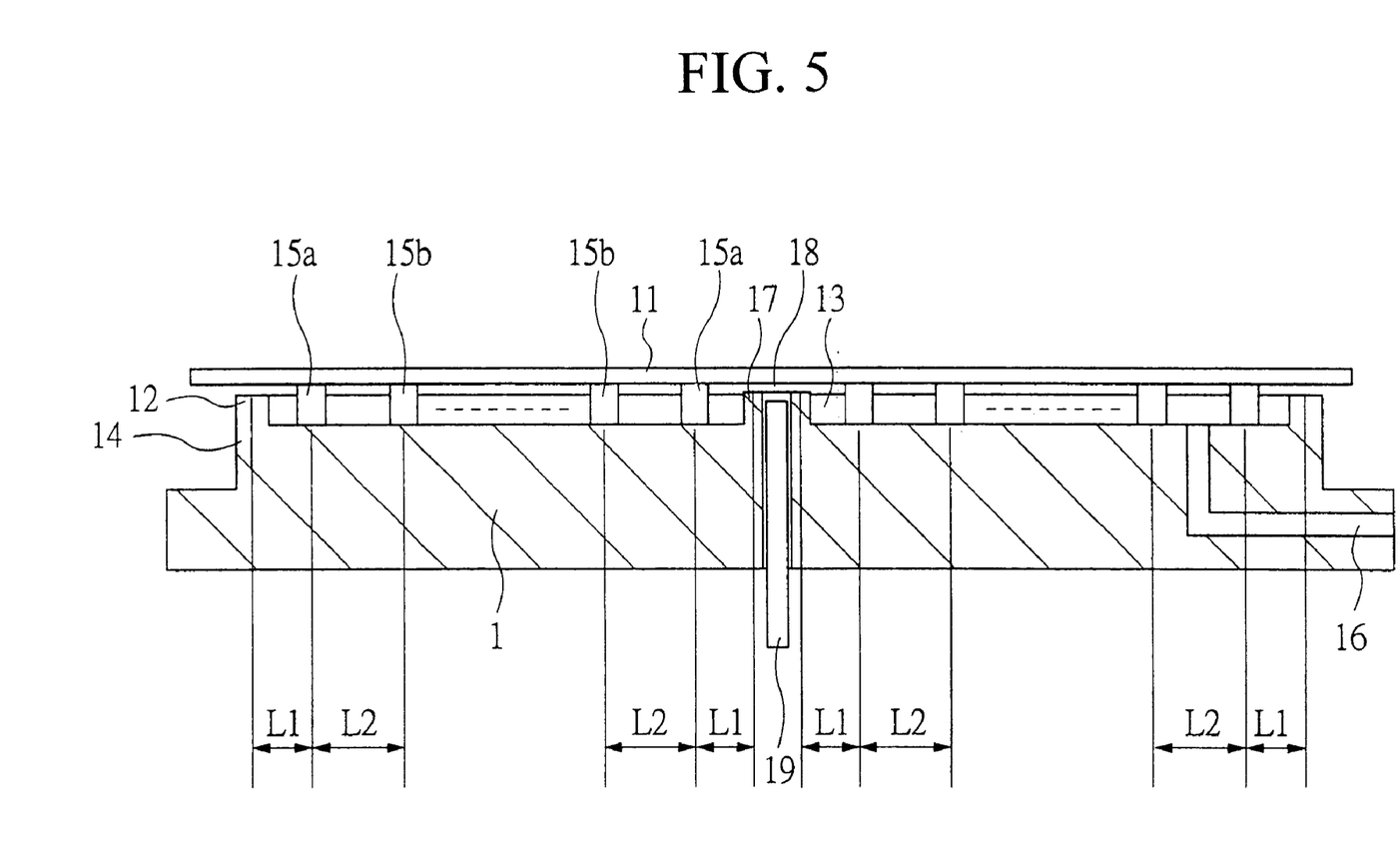
FIG. 5 is a sectional view showing a modification of the wafer chuck according to the embodiment of the present invention.

In each of the wafer chucks 1 according to Embodiments 1 to 3, the same operational effects as those to the external wall 12, the closest support pins 15a, and the support pins 15b on the second circular line can be obtained for an internal wall 17 having a press-up hole 18 for a press-up pin 19 arranged a portion near the center of the wafer chuck 1 as shown in FIG. 5 and used to convey the semiconductor wafer 11, for the closest support pins 15a to the internal wall 17, and for the support pins 15b on the second circular line from the internal wall.

As described above, the wafer chuck 1 described in this embodiment prevents warpage near the external wall 12 of the chucked semiconductor wafer 11 and the internal wall 17 to flatly chuck the semiconductor wafer 11. For this reason, when this embodiment is applied to the wafer chuck 1 of an exposure system illustrated in FIG. 1, a circuit pattern having a preferable resolution can be transferred to the semiconductor wafer 11 without changing focal lengths of the reduction lens 10 to the respective parts of the semiconductor wafer 11.

(Embodiment 5)

In the embodiment described above, the case in which the semiconductor wafer 11 having a specific size is vacuum-fixed by one external wall 12 has been exemplified. However, external walls 12 having different diameters may be arranged at once, and a plurality of semiconductor wafers 11 having different sizes may be vacuum-fixed.

Figure 6:
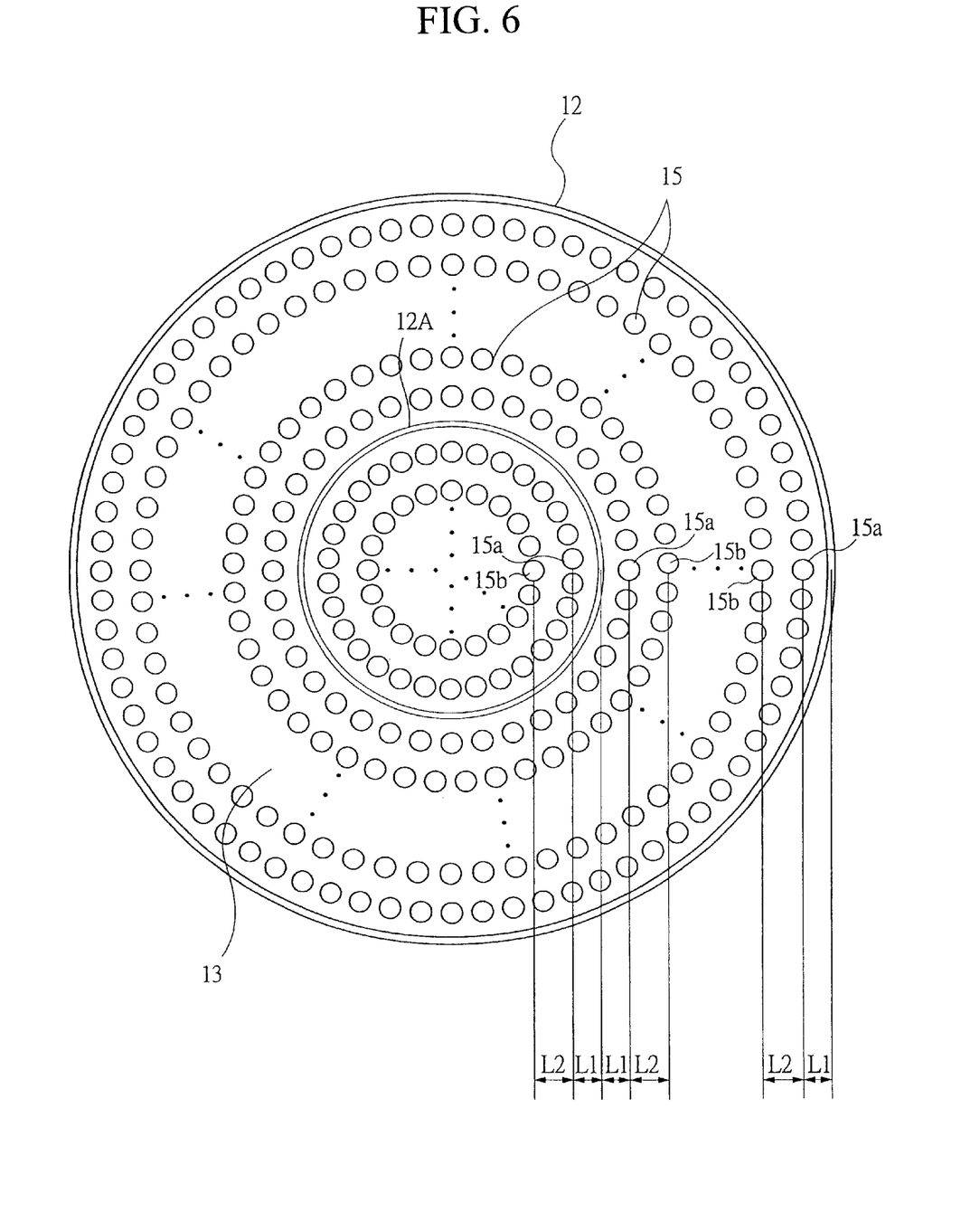
FIG. 6 is a plan view showing a modification of the wafer chuck according to the embodiment of the present invention.

More specifically, in the wafer chuck 1 illustrated in FIG. 6, an external wall 12A is arranged inside the external wall 12. In this manner, one wafer chuck 1 can be used to vacuum-fix any one of a semiconductor wafer 11 having a small diameter corresponding to the external wall 12 and of a semiconductor wafer 11 having a large diameter corresponding to the external wall 12A.

In this case, the external wall 12 and the external wall 12A are not in contact with the rear surface of the semiconductor wafer 11 even though any one of the wafers semiconductor wafers 11 having the small diameter and the large diameter. For this reason, when the configuration of the internal wall 17, the press-up hole 18, the press-up pin 19, and the like which are illustrated in FIG. 5 is merely arranged at the central portion of the innermost external wall 12, negative-pressure vacuum on the entire surface of the semiconductor wafer 11 can be realized.

According to Equation 1, a linkage Q is in proportion to a peripheral length b. For this reason, in order to maintain dP at a value required for vacuum, a gap δ between given walls must be smaller than a gap δ between walls outside the given walls.

When semiconductor wafers having different diameters are not targeted, and when a semiconductor wafer having a large warpage is vacuumed, the semiconductor wafer is sequentially vacuumed from the central portion. In this manner, problems of vacuum fault caused by warpage can be considerably reduced. In this case, the difference between the levels of internal banks (peripheral walls) is set to be up to 0.3 mm which is generally considered as a limit for reliably performing vacuuming, and may be set to be 0.1 μm or more.

(Embodiment 6)

Figure 7:
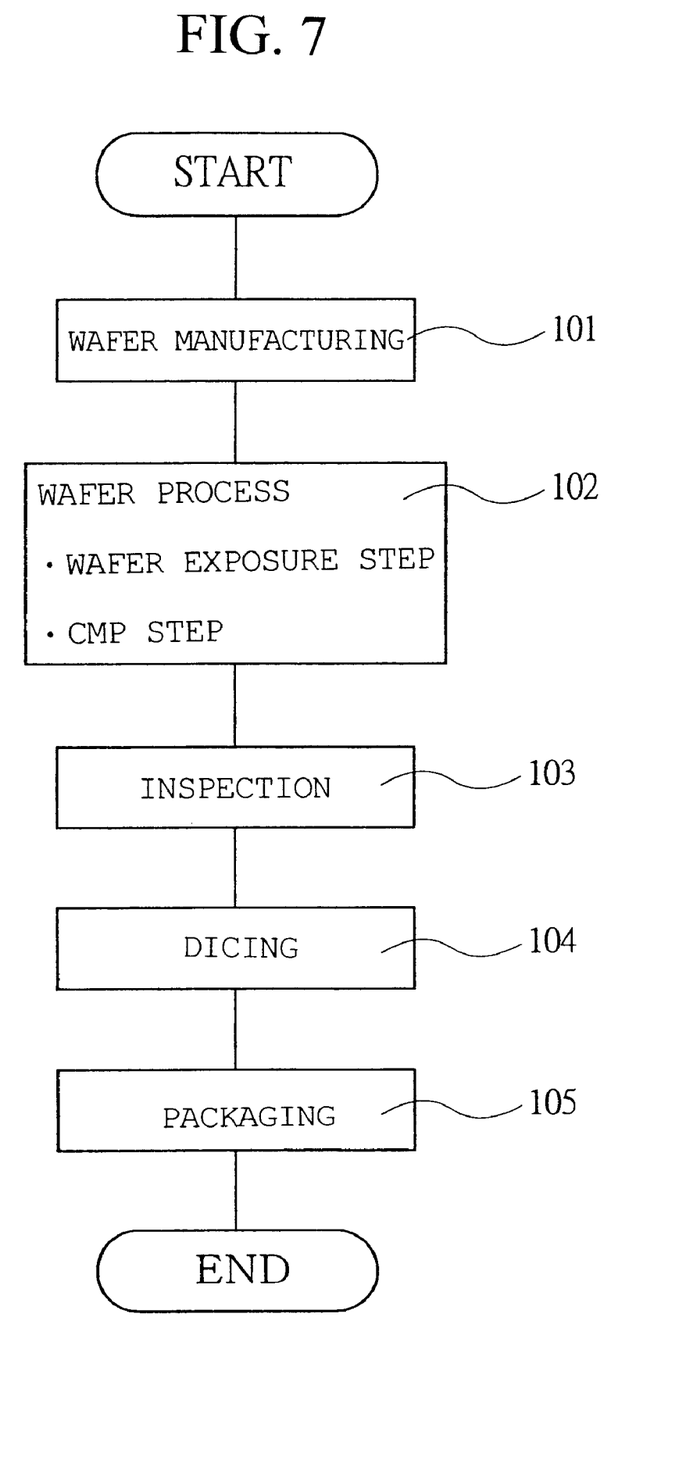
FIG. 7 is a flow chart showing an example of a method of manufacturing a semiconductor device according to the embodiment of the present invention.

FIG. 7 illustrates a flow chart showing an example of a method of manufacturing a semiconductor device using the wafer chuck and the exposure system including the wafer chuck.

More specifically, a semiconductor substrate obtained by slicing an ingot consisting of monocrystalline semiconductor is polished to manufacture a semiconductor wafer 11 (step 101).

In the known wafer process, a circuit pattern for a semiconductor device is transferred to and formed on the semiconductor wafer 11 by photolithography using the exposure system in FIG. 1. At this time, when the wafer chuck 1 according to each of the embodiments described above is used to fix the semiconductor wafer 11 to the exposure system, the circuit pattern having a preferable resolution can be transferred to the semiconductor wafer 11 without changing the focal lengths of the reduction lens 10 to the respective parts of the semiconductor wafer 11.

In this wafer process, the surface of the semiconductor wafer 11 is flattened by a CMP (chemical mechanical polishing) technique or the like to prevent adverse affect to an uneven upper surface of the wafer base portion in a multilevel interconnection structure or the like. When the wafer chuck 1 according to each of the embodiments is used to chuck the semiconductor wafer 11 in a polishing device for executing the CMP technique, high-level flattening can be performed such that maximum flexures at the respective parts of the semiconductor wafer 11 are controlled to 50 nm or less, reduction or the like of circuit pattern defects of the upper layer caused by the unevenness or the like of the base can be realized (step 102).

In the semiconductor wafer 11 on which a large number of semiconductor devices are formed at once by the above wafer process, the functions of the respective semiconductor devices are inspected by a wafer probe or the like (step 103). Furthermore, in the dicing step for the semiconductor wafer 11, the plurality of semiconductor devices are separated into independent chips (pellets) (step 104), and only chips which are determined as nondefective chips in the inspection step in step 103 are packaged (step 105).

In this manner, semiconductor devices serving as products are completed. In this embodiment, as described above, the semiconductor wafer 11 is chucked by the wafer chuck 1 with a high degree of flatness and exposed. For this reason, high accuracy of focal lengths of the reduction lens 10 to the respective parts of the semiconductor wafer 11 is achieved, and improvement in transfer accuracy of a circuit pattern can be realized.

When the wafer chuck 1 according to this embodiment is applied to the CMP step, reduction of defects such as disconnection in a multi-layered interconnection structure can be realized by high-level flattening of the semiconductor wafer 11 in the CMP step. As a result, a high yield in the steps in manufacturing semiconductor devices can be achieved.

The present made by the present inventor has been concretely described on the basis of the embodiments. However, the present invention is not limited to the embodiments, and various changes and modifications can be effected without departing from the spirit and scope of the invention as a matter of course.

In the above description, the invention made by the present invention has been explained with respect to an optical exposure system in the field of the invention which is the background of the invention. However, the present invention is not limited to the optical exposure system, and the present invention can be applied to an electron beam exposure system, and not only these exposure systems, but also various semiconductor manufacturing devices and semiconductor inspection devices which must flatly chuck semiconductor wafers.

In addition, the present invention can be applied to not only the steps in manufacturing a semiconductor device but also the steps in manufacturing liquid crystal or the like.

INDUSTRIAL APPLICABILITY

Effects obtained by typical one of the aspects of the invention disclosed in this application will be briefly described below.

More specifically, according to the wafer chuck of the present invention, when external air is sucked into a suction chamber by a space between a semiconductor wafer and the upper surface of an external wall, a pressure loss caused by a viscosity resistance to establish a vacuum seal between the suction chamber and the outside, and the semiconductor wafer can be vacuum-chucked by only support pins. In this manner, uniform vacuum chucking can be performed in an entire area subject to wafer vacuuming, and vacuum chucking can be performed with an extremely high degree of flatness.

According to the wafer chuck of the present invention, an effect that semiconductor wafers having various diameters can be vacuum-chucked by one wafer chuck can be achieved.

According to an exposure system using the wafer according to the present invention, since the degree of flatness of a chucked semiconductor wafer including its peripheral portion increases, focal lengths do not change in the entire area of the semiconductor wafer, and a circuit pattern having a preferable resolution can be transferred to the semiconductor wafer.

When a wafer chuck according to the present invention is used in a semiconductor wafer polishing device, a polished surface having a high degree of flatness can be obtained.

According to the above (3) and (4), in a method of manufacturing a semiconductor device using the wafer chuck of the present invention, non-defective semiconductor chips can be manufactured in the entire area of the semiconductor wafer, and a yield of semiconductor devices can be increased.

What is claimed is:

1. A wafer chuck for flatly vacuum-chucking a semiconductor wafer supported on support pins by suction with a suction chamber at a negative pressure applied thereto, said suction chamber surrounded by a first peripheral wall, wherein:
    an upper surface of the first peripheral wall is formed to be lower than upper surfaces of the support pins, and the upper surface of the first peripheral wall is not in contact with the semiconductor wafer; and
    a first distance between the first peripheral wall and first closest support pins of the support pins is set to be shorter than a second distance between the first support pins and second support pins positioned inside the first support pins.

2. A wafer chuck according to claim 1, wherein the first distance is not less than 0.2 mm and not more than 1.8 mm.

3. A wafer chuck according to claim 1, wherein a difference between the level of the upper surface of the first peripheral wall and the level of the upper surfaces of the support pins falls within a range of 0.1 μm to 1.4 μm.

4. A wafer chuck according to claim 1, wherein the first support pins are arranged to make one circle along the first peripheral wall, and the second support pins on a second circular line are arranged inside the closest support pins with a distance falling within a range of 1 mm to 2.5 mm.

5. A wafer chuck according to claim 1, wherein at least one second peripheral wall is arranged inside the first peripheral wall, a positional relationship between the first support pins and the second peripheral wall inside or outside the second peripheral wall is equivalent to a positional relationship between the first peripheral wall and the first support pins in the wafer chuck.

6. A wafer chuck according to claim 5, wherein a difference between the level of the upper surface of the second peripheral wall and the level of the upper surface of the first support pins falls within a range of 0.1 μm to 0.3 mm.

7. A wafer chuck according to claim 5, wherein the support pins are not arranged inside the second peripheral wall, and a pressure inside the second peripheral wall is the atmospheric pressure.

8. An exposure system including a wafer chuck on which a semiconductor wafer is placed; exposure light source; and a projection optical system for irradiating exposure light emitted from the exposure light source, passing through an exposure original on the semiconductor wafer, wherein the wafer chuck supports the semiconductor wafer on support pins by suction with a suction chamber at a negative pressure applied thereto, said suction chamber surrounded by a first peripheral wall, wherein:
    an upper surface of the first peripheral wall is formed to be lower than upper surfaces of the support pins, and the upper surface of the first peripheral wall is not in contact with the semiconductor wafer; and
    a first distance between the first peripheral wall and first closest support pins of the support pins is set to be shorter than a second distance between the first support pins and second support pins positioned inside the first support pins.

9. A method of manufacturing a semiconductor device which performs wafer processes including a polishing process and a photolithography process to a semiconductor wafer to form a semiconductor device, wherein
    a wafer chuck for chucking the semiconductor wafer is used in at least one of the polishing process and an exposure system used in the photolithography process, wherein the wafer chuck supports the semiconductor wafer on support pins by suction with a suction chamber at a negative pressure applied thereto, said suction chamber surrounded by a first peripheral wall, wherein:
    an upper surface of the first peripheral wall is formed to be lower than upper surfaces of the support pins, and the upper surface of the first peripheral wall is not in contact with the semiconductor wafer; and
    a first distance between the first peripheral wall and first closest support pins of the support pins is set to be shorter than a second distance between the first support pins and second support pins positioned inside the first support pins.

10. A method of manufacturing a semiconductor device according to claim 9, characterized in that the polishing process is a chemical mechanical polishing (CMP) process.

* * * * *